United States Patent [19]
Marlinski

[11] 3,963,551
[45] June 15, 1976

[54] METHOD FOR BONDING SEMICONDUCTOR CHIPS

[75] Inventor: Edward J. Marlinski, Rochester, N.Y.

[73] Assignee: Stromberg-Carlson Corporation, Rochester, N.Y.

[22] Filed: Jan. 17, 1975

[21] Appl. No.: 541,831

Related U.S. Application Data

[62] Division of Ser. No. 448,330, March 5, 1974, Pat. No. 3,933,187.

[52] U.S. Cl. ............................ 156/295; 29/626; 156/299
[51] Int. Cl.² ..................................... H05K 3/00
[58] Field of Search .......... 156/295, 297, 299, 356, 156/330, 378; 29/577, 589, 626; 427/9, 207, 256, 286; 222/420, 386, 526; 401/193

[56] References Cited
UNITED STATES PATENTS

| | | | |
|---|---|---|---|
| 2,678,557 | 5/1954 | Black | 401/5 |
| 3,572,400 | 3/1971 | Casner et al. | 222/420 |
| 3,715,258 | 2/1973 | Cunnane | 156/356 |
| 3,810,779 | 5/1974 | Pickett et al. | 222/420 |
| 3,834,966 | 9/1974 | Kelly | 156/299 |

*Primary Examiner*—Douglas J. Drummond
*Assistant Examiner*—Michael W. Ball
*Attorney, Agent, or Firm*—William F. Porter, Jr.; Edward A. Gerlaugh

[57] ABSTRACT

Apparatus and method for the uniform dipensing of a conductive epoxy binder in hybrid microcircuit applications. A method is disclosed of uniformly pressurizing a conductive epoxy binder through a small orifice until a droplet of fixed volume forms, setting a predetermined gap size between a contact pad and the droplet in order to control the shape and size of the epoxy droplet left on the pad as the droplet touches it, and then releasing the pressure while reciprocating the dispenser from the pad. Also, apparatus, including a cylindrical limiting means attached to the dispenser tip, is disclosed for ensuring the gap size is constant. Other embodiments of the limiting means provide for the use of a relieved section which assists in preventing contamination and for adjusting means operable to vary the gap size.

3 Claims, 5 Drawing Figures

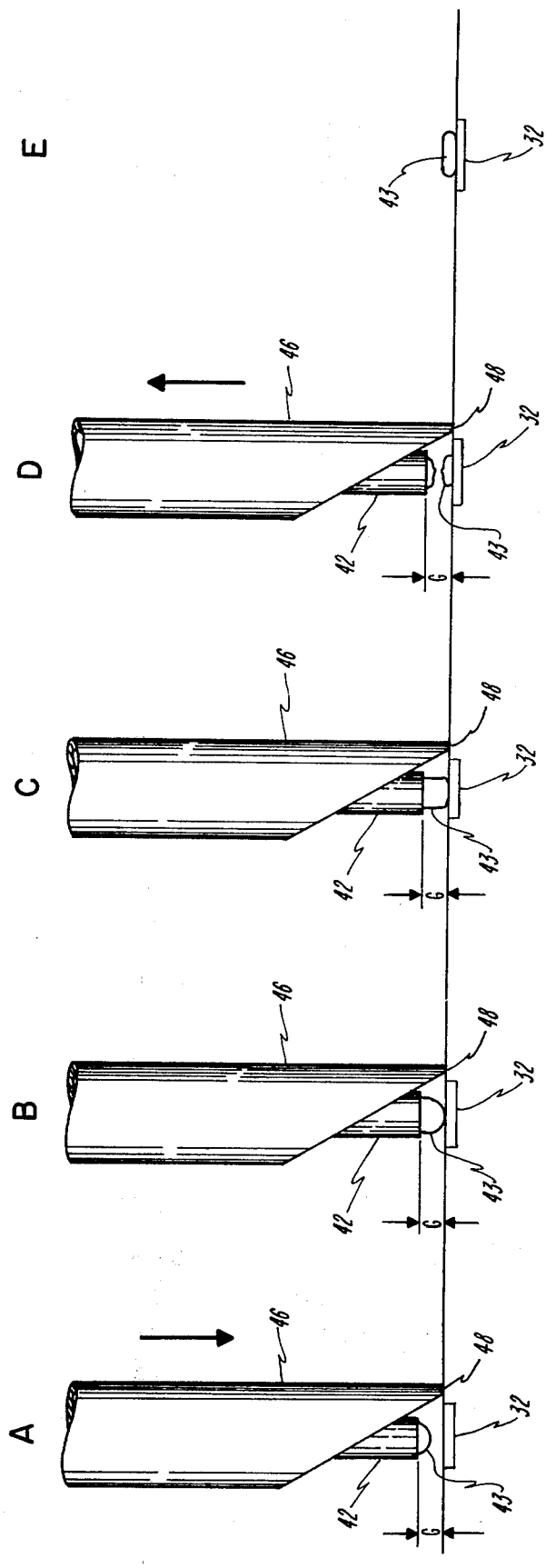

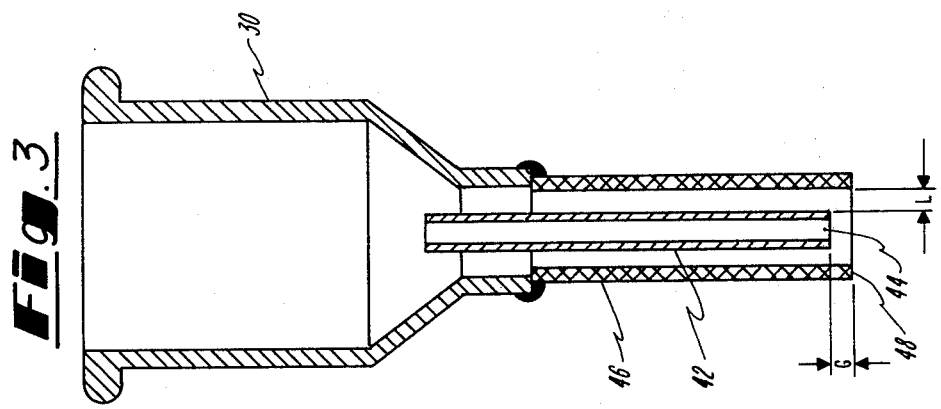
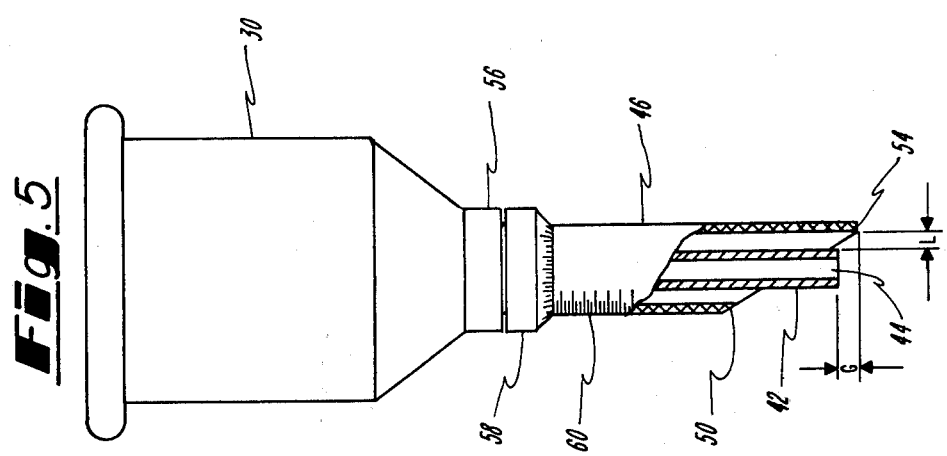
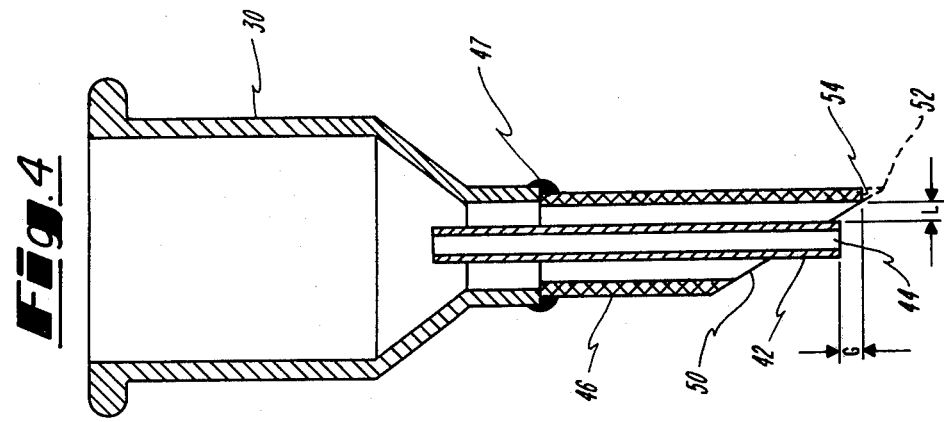

METHOD FOR BONDING SEMICONDUCTOR CHIPS

This is a division of application Ser. No. 448,330, filed Mar. 5, 1974, now U.S. Pat. No. 3,933,187.

BACKGROUND OF THE INVENTION

This invention pertains generally to the assembly of microcircuitry and more specifically to the mounting, by means of a conductive epoxy bonding resin, of a plurality of miniature transistor chips on a hybrid circuit base having contact pads thereon.

The manufacture of hybrid circuits resembles, on the one hand, integrated circuit technology and, on the other, discrete component technology, hence the name hybrid. The hybrid technology is similar to the discrete component manufacturing process in that each active device or transistor chip is assembled independently onto a larger circuit base and is different from the discrete technology because the active device remains unencapsulated until the entire circuit is assembled.

Circuitry of the hybrid type resembles the integrated technology more closely in that the basic circuit is etched onto a ceramic base covered with a thin gold film. The film is approximately 300 A thick and defines most of the circuit connections that fit onto a ceramic base small enough to be encapsulated into a standard size dual in-line package. This allows compatability with integrated circuit technology while still retaining the flexibility of discrete component circuitry, a basic advantage of hybrid technology.

The small active component chips (10×10 mils) in each circuit are usually individually bonded with a conductive epoxy to somewhat larger gold areas (20×10 mils) normally called contact pads. The conductive epoxy is generally applied to the pads by epoxy dispensing machines having a long cylindrical dispensing tip for making dots of epoxy. The machines in the prior art known to be available for this type of application are those manufactured and sold by Motion Dynamics Research Inc., Mech-El Ind Inc. and Laurier Associates.

There have been some problems using these prior art machines in the assembly of the beforementioned hybrid circuits for which the invention provides a solution. One problem has been contamination of the circuitry by the dispensing tip. If the dispenser touches the circuitry, any accumulation of dust or other foreign particulate matter on the sides and edges thereof many contaminate the surface of the gold etching. It is particularly critical that this not happen since the circuit has yet to be encapsulated into a protective plastic container. The contaminants may have the undesirable effect of altering the electrical characteristics of the circuitry. Any epoxy left on the dispensing tip following each dispensing operation provides an environment conducive to such contamination.

Another problem with prior art machines has been the separation of the conductive epoxy binder into its respective components. The conductive epoxy binder is formed by the suspension of conductive particles such as gold or silver (filler) in a resin type binder (carrier). This type of suspension tends to become unbalanced or separated into its individual components of carrier and filler in response to any friction between the filler and the inner dispenser wall. Such unbalancing or separation is a function of two variables — (1) the particulate size of the filler and (2) the diameter of the orifice through which the binder is dispensed.

If the orifice is too small or the filler particles too large, the particles will drag along the inner walls of the dispenser causing a bunching effect and a resulting unbalance in the ratio of filler to resin deposited. The bunching of the filler particles left behind eventually causes the cylindrical orifice of the dispenser to clog and thereby cause production time losses. More importantly, the unbalanced deposited epoxy is less conductive than before since it has many less conductive particles than is desirable in the amount deposited. The resulting higher resistance of the deposited epoxy is undesirable as it becomes an unpredictable circuit parameter caused by the construction and assembly. The prior art has partially solved this problem by providing epoxies with smaller particle sizes and by the use of larger dispenser orifices. However, the larger sized orifices that are needed to produce acceptable results in terms of proper binder composition are much more difficult to control as to the reproducibility in size of the epoxy dot or drops deposited.

It is extremely important that the epoxy dot deposited be reproducible as to shape and size. A dot that is of a larger area than usual will flow or be squeezed by a chip being bonded thereon onto other circuitry and cause unwanted electrical connections since the epoxy is a conductive suspension. If the area of the conductive epoxy deposited is smaller than usual, the electrical connection between the chip and the mounting pad may be of higher resistance than can be tolerated. The mechanical bond between the chip and mounting pad may also be weakened by smaller-that-designed-for dot areas.

One of the better ways to ensure reproducibility of a dot of conductive epoxy having a uniform area and size would be to regulate the gap distance between the work and the orifice tip of the dispenser. Most of the dispensing machines available have a micrometer control on the dispenser for attempting to effect a uniform gap distance, but fail to do so for a number of reasons. After the gap has been set on the micrometer dial, changes in height of the work holder may cause the dot size to vary as the dispenser is moved to different contact pads on the ceramic hybrid circuit base. The hybrid circuit base itself may change in thickness as it is quite difficult to manufacture the ceramic base uniformly over large areas. Even the pitch or slant of the work holder will cause these dots to be non-uniform across the entire work piece.

BRIEF DESCRIPTION OF THE INVENTION

The invention relates to a method and apparatus for reproducing small dots of conductive epoxy (5 mils in diameter or less) on a plurality of etched contact pads spaced apart on a ceramic hybrid circuit base. The method consists of forcing the conductive epoxy through a dispenser under gas pressure until a drop of a predetermined size begins to form on the tip of the dispenser. The drop barely touches a mounting pad as the dispenser is kept at a uniform distance from the pad. Next the pressure is released and the dispenser reciprocated to shear a uniform epoxy deposit away from the dispenser. The shearing takes place because the surface of the pad adheres to the epoxy that touches it. Finally, a semiconductor chip is placed onto the epoxied contact pad. The bonding process is continued by moving the dispenser to a different contact pad on the ceramic base and depositing another epoxy dot uniform in size and volume with the first epoxy dot without necessitating the resetting of the gap size. The method continues until the desired number of pads are epoxied and have chips attached thereto on the hybrid circuit base.

The invention also includes means for ensuring the uniformity of the gap size. One embodiment of this aspect of the invention uses a cylindrical spacing stop that contacts the surface of the hybrid circuit base before the dispenser tip. This novel spacing stop solves the problem of filler separation and uniform dot size by creating a reproducible gap each time a drop of epoxy is dispensed. The reproducible gap also allows a larger orifice size to be used, thereby reducing the problem of filler separation to a negligible amount, since the dispenser then can be controlled by limiting the travel of the tip precisely and thereby selectively controls the amount of droplet area that touches the pad.

A second embodiment of this aspect of the invention includes an elongated apex formed on the cylindrical stop by relieving a section of the cylinder. Provision of the apex reduces the problem of contamination even further as only a small part of the apex touches the hybrid circuit base. This aspect also facilitates the inspection of the dispensing tip and provides clearance for cleaning the tip when needed.

A third embodiment of this aspect of the invention provides means for presetting the gap distance of the stop. This aspect is useful in varying the epoxy dot size from circuit base to circuit base while maintaining uniform dot size on each base.

Accordingly, it is an object of the present invention to provide a method and apparatus for insuring reproducibility of epoxy dot sizes of 5 mils or under in diameter that will not vary more than ± ½ mils.

It is a further object of this invention to prevent filler separation from the carrier of the conductive epoxy used in bonding.

Still another object of this invention is to prevent contamination of the hybrid circuitry on the ceramic base before encapsulation.

Other objects, features and advantages of the present invention will become apparent from the following description of the preferred embodiments, taken together with the accompanying drawings.

BRIEF DESCRIPTION OF THE DRAWINGS

FIG. 2 is an enlarged view of the dispenser in segmented time frames using the method provided by the invention.

FIG. 3 is an enlarged sectional view of the dispenser tip of the bonder shown in FIG. 1 including means to limit the dispenser travel.

FIG. 4 is an enlarged sectional view of the dispenser tip of the bonder shown in FIG. 1 including another embodiment of the limiting means shown in FIG. 3.

FIG. 5 is an enlarged view, partially in side elevation and partially in cross-section, of the dispenser tip of the bonder shown in FIG. 1 including a third embodiment of the limiting means shown in FIG. 3.

DETAILED DESCRIPTION OF THE INVENTION

Figure 1:
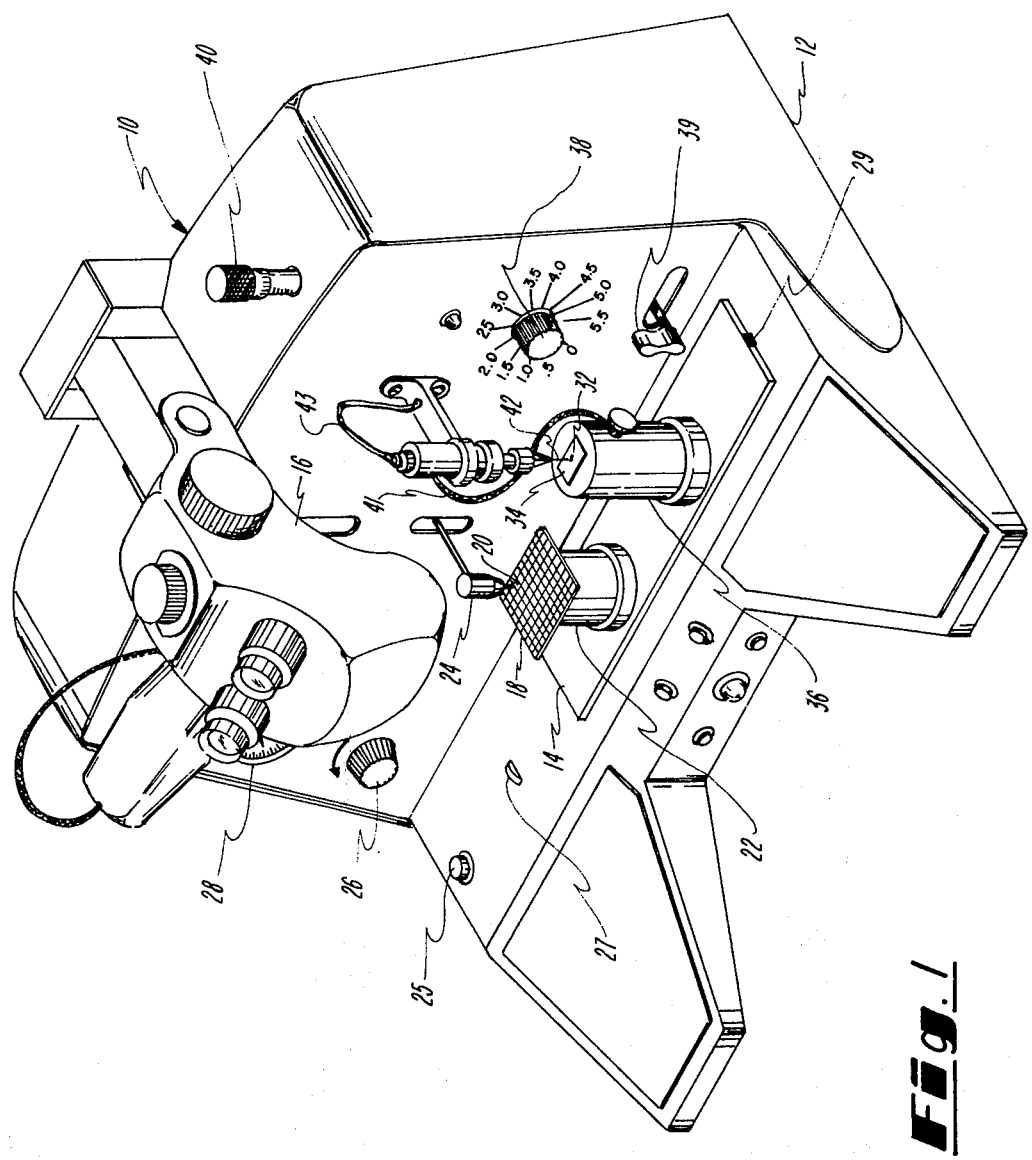
FIG. 1 is a perspective view of an epoxy bonder which utilizes the method and apparatus of the invention.

FIG. 1, which illustrates the apparatus and method of the invention to advantage, shows an epoxy bonding machine 10 having a base 12 and a sliding work platform 14. An observation mechanism, such as a microscope 16, is provided for the operator of the bonding machine 10 to allow the visual inspection of the area adjacent to a matrix 18, which contains a plurality of semiconductor chips or dice 20 and which is supported by a matrix holder 22 resting on the work platform 14. Associated with the matrix 18, containing a plurality of minute semiconductor chips 20, is a vacuum pickup 24 having an internal vacuum regulation solenoid (not shown).

Spaced laterally from the vacuum pickup 24 and above the platform 14 is an epoxy dispenser 30 that is operable to deposit epoxy on a contact pad 32 etched on the surface of a ceramic base 34. The ceramic base 34 is held in place in a recess (not shown) on a work holder 36 resting on the work platform 14. The flow of epoxy, which has been mixed and placed in the dispenser 30, is controlled by pressurized (typically 10–100 p.s.i.) clean air or nitrogen gas which flows into the dispenser 30 from a supply (not shown) via a tube 43 (which is regulated by the combination of an epoxy pressure dial 26 and a time adjustment knob 38) and by a micrometer dial 40.

The operator effects the eopxy bonding of one of the transistor semiconductive chips 20 to the contact pad 32 in the following manner. The operator moves the work platform 14 to a completely left stopped position in which the work holder 36 is positioned such that the contact pad 32 to be epoxied is positioned directly below the vacuum pickup 24. When the contact pad 32 is precisely positioned beneath the vacuum pickup 24, the work holder 36 may be locked into position on the platform 14 by depressing a vacuum button 25 which energizes a pump (not shown) which creates a vacuum activating a vacuum line 41 (which communicates with a recess disposed below the work holder 36) and thereby supplies a holding force between the work holder 36 and the platform 14.

The platform 14 is then moved to a completely right stopped position where the contact pad 32 is disposed directly beneath the dispenser 30. The movement of the platform 14 between the left stop 27 and the right stop 29 provides the correct lateral positioning of the contact pad 32 below the dispenser 30 and the pickup 24, respectively.

After the epoxy dispenser 30 has been suitably positioned at a predetermined height above the work holder 36 and contact pad 32 by appropriately setting the micrometer dial 40 and the pressure dial 26 and time adjustment knob 38 have been adjusted for the desired flow of epoxy, the dispenser 30 is then lowered to deposit a drop of epoxy having a predetermined size on the contact pad 32 of the ceramic base 34 by a first operation of a control lever 39 in the conventional manner. The settings of the pressure-time adjustments 26, 38 provide a drop of epoxy that has a predetermined volume as it forms on a dispenser tip 42. As long as the gap distance between the dispenser tip 42 and the contact pad 32 remains constant, the size and shape of the drop deposited can be controlled within limits to a reasonable certainty. The dispenser 30 is then reciprocated from the contact pad 32 after the deposition of the conductive epoxy onto the surface of the contact pad.

The first operation of the control lever 39 also lowers the vacuum pickup 24 from its home position into the matrix 18 to lightly pick up a chip 20 and the pickup 24 then automatically reciprocates into its home position. Next the work holder 36 is moved on the platform 14 to the left stopped position ready to receive a chip 20. The pickup 24 is then lowered to place and the transistor chip 20 held onto its tip is dropped onto the contact pad 32 by releasing the vacuum holding the chip to the pickup 24 by a second operation of the control lever 39 in the conventional manner. The process is repeated until the desired number of transistor chips have been epoxied to different contact pads 32. Of course it is obvious that the bonding technique may be accomplished by reversing some of the steps described above or even completing a series of identical steps such as epoxying all pads 32, before the other steps are taken if other types of available bonders are used.

A more detailed illustration of the deposition of the conductive epoxy on the contact pad 32 is shown in FIG. 2. The figure has been segmented into five time frames A-E. The time parameter increases frm left to right across the figures with FIG. 2A being the first in time.

A pressure source (not shown) is used to force a conductive epoxy drop 43 to form below the dispenser tip 42 of the bonding machine 10 while the dispenser 30 is being lowered toward the contact pad 32. The dispensing tip 42 is lowered until the lower edge of a spacing means 46 (which is fixed to and surrounds the lower end of the dispenser 30) contacts the surface of the circuit board and ensures the discontinuance of the vertical axis travel of dispenser 30. As FIG. 2B illustrates, the gas pressure within dispenser tip 42 is continued for a predetermined amount of time, which allows the drop 43 to barely touch the contact pad 32. Because the spacing means 46 maintains a constant gap between the dispenser tip 42 and the contact pad 32, a controlled amount of epoxy can be deposited on the contact pad 32. The amount deposited may be varied over a small range as long as the gap size (G) remains constant, by varying the amount of pressure within the dispenser tip 42 and the time it is applied by the pressure dial 26 and the time adjustment knob 38, respectively. The drop 43 adheres to the contact pad 32 and the gas pressure is released after the controlled amount has been dispensed as shown in time segment FIG. 2C. Thus it is seen a controlled amount has been deposited because the surface area of the drop 43 touching the surface has been precisely determined by the constant gap (G). The main determinant of the amount of epoxy deposited is the spacing defined by the gap (G). The dispenser 30 is reciprocated from the surface, and the deposited epoxy adheres to the contact pad 32 as shown in FIGS. 2D-E. Typically, the drop 43 deposited by this method is about 5 mils ± ½ mils in diameter or smaller with an elevation of approximately 1 or 2 mils above the contact pad 32. The drop 43 is now ready to bond a semiconductor chip to the contact pad 32 as hereinbefore described.

FIGS. 3–5 illustrate three embodiments of the novel spacing means used to ensure that the gap distance between the contact pad 32 and the dispenser orifice remains constant. FIG. 3 shows the dispenser 30 filled with epoxy and having a dispenser tip 42 with a dispenser orifice 44. An annular spacing means 46 is attached to the dispenser 30 by a weld or epoxy at 47 and extends beyond the dispenser tip 42 by a gap (G) and a radial clearance (L). The gap size may be varied depending upon the size of the drop of conductive epoxy required to be dispensed with a typical gap size for a 5 mil in diameter drop being approximately 1 mil. The lateral clearance is provided in order to protect the dispenser tip 42 from clogging and further to provide enough distance between the tip 42 and spacing means 46 so that epoxy does not collect on and contaminate the lower end 48 of the spacing means that must come into contact with the surface of the ceramic base 34. The clearance generally corresponds to the differences between needles of a No. 20 size and a No. 28 size.

Another embodiment of the spacing means 46 is illustrated in FIG. 4. A portion of the cylinder has been removed leaving a substantially planar edge 50 and an apex 52 where the planar edge intersects the outer circumference of the spacing means end 48. The apex 52 is truncated to form a planar surface 54 for stopping the dispenser 30 when it makes contact with the circuitry disposed on the ceramic base 34. The planar surface 54 actually forms an acute arc of the cylinder portion that is truncated. This relieved portion of the spacing means 46 has two purposes, that of facilitating the access to the dispenser tip 42 for inspection and cleaning and that of minimizing the amount of stopping area (planar surface 54) required to come into contact with the circuitry, thereby reducing contamination. This configuration also provides the same gap (G) and clearance (L) as the cylindrical spacer embodiment shown in FIG. 3 while maintaining a great deal of strength in the structure. The planar surface 54 is then analogous to the spacing means end 48 in the embodiment of FIG. 3.

Still another embodiment of the spacing means 46 is shown in FIG. 5, in which a calibration means 56 is provided to allow the spacing means 46 to be adjusted up or down, which permits each dispenser 30 to be used to provide more than one size of epoxy drop. The calibration means 56 includes adjustment means 58 that may be rotated to raise or lower the spacing means 46 and a calibration line 60 for allowing adjustment in discrete increments of a known distance.

The specific embodiments and methods disclosed herein are intended to be merely illustrative and not restrictive of the invention since various modifications readily apparent to those familiar with the art to which the invention pertains can be made without departing from the scope and spirit of the invention as claimed hereinbelow.

What is claimed is:

1. In a method for bonding a semiconductor chip to a contact pad in a hybrid circuit using a tubular dispenser having a dispenser tip, comprising the steps of:
   a. pressurizing a conductive epoxy within the dispenser until a small drop forms adjacent the end of the dispenser tip;
   b. touching said epoxy drop to said contact pad;
   c. releasing the pressure within the dispenser;
   d. reciprocating said dispenser tip away from said contact pad, thereby leaving a deposit of epoxy on said pad; and
   e. placing a chip on said deposit of epoxy, the improvement comprising the steps of:
   f. providing a stop mechanism reciprocatable together with said dispenser tip and spaced apart from and extending downwardly a distance beyond said dispenser tip, and
   g. bringing the dispenser tip from a first, upper, position to a second, lower, position at a predetermined distance, which is independent of work and work holder variations and is determined by the distance by which said stop mechanism extends beyond said dispenser tip, from the upper surface of said pad, thereby touching only a predetermined area of said epoxy drop to said contact pad.

2. The method as defined in claim 1 further comprising the step of repeating steps a-g for each additional contact pad on the hybrid circuit.

3. The method as defined in claim 1 further comprising the steps of providing means for adjusting said distance by which said stop mechanism extends beyond said dispenser tip and adjusting said distance by which said stop mechanism extends beyond said dispenser tip.

* * * * *